United States Patent [19]

Vogel

[11] Patent Number: 4,901,075

[45] Date of Patent: Feb. 13, 1990

[54] METHOD AND APPARATUS FOR BIT RATE REDUCTION

[75] Inventor: Peter Vogel, Diepersdorf, Fed. Rep. of Germany

[73] Assignee: U. S. Philips Corporation, New York, N.Y.

[21] Appl. No.: 96,177

[22] Filed: Sep. 11, 1987

[30] Foreign Application Priority Data

| Sep. 13, 1986 [DE] | Fed. Rep. of Germany | 3631252 |
| Nov. 8, 1986 [DE] | Fed. Rep. of Germany | 3638127 |
| May 23, 1987 [DE] | Fed. Rep. of Germany | 3717399 |

[51] Int. Cl.$^4$ ............................................. H03M 7/46
[52] U.S. Cl. ........................................ 341/63; 341/59; 358/261.1
[58] Field of Search .................. 340/347 DD; 358/13, 358/136, 138, 261.2, 261.3, 261.4, 263, 261.1; 341/63, 106; 375/25

[56] References Cited

U.S. PATENT DOCUMENTS

| 4,101,934 | 7/1978 | Fukuoka | 341/63 |
| 4,316,222 | 2/1982 | Subramaniam | 358/261.4 |
| 4,394,774 | 7/1983 | Widergren et al. | 340/347 DD |
| 4,698,672 | 10/1987 | Chen et al. | 358/136 |

*Primary Examiner*—William M. Shoop, Jr.
*Assistant Examiner*—Brian K. Young
*Attorney, Agent, or Firm*—Michael E. Marion

[57] ABSTRACT

A method and apparatus for coding a signal for transmission in order to achieve improved reduction in the bit rate. A signal is a transform coded in order to form a sequence of zero coefficients and non-zero coefficients, and run lengths of zero coefficients together with preceding or subsequent non-zero coefficients are grouped as events and coded.

13 Claims, 5 Drawing Sheets

| L ≥9 | 1253 | 55 | 5 | 4 | 0 | 0 | 0 | 0 | 0 |
|---|---|---|---|---|---|---|---|---|---|
| 8 | 252 | 16 | 1 | 1 | 1 | 0 | 1 | 0 | 0 |
| 7 | 316 | 35 | 6 | 0 | 1 | 0 | 0 | 0 | 0 |
| 6 | 389 | 35 | 5 | 0 | 0 | 0 | 0 | 0 | 0 |
| 5 | 516 | 65 | 12 | 3 | 3 | 1 | 2 | 0 | 1 |
| 4 | 567 | 94 | 29 | 9 | 1 | 2 | 1 | 0 | 0 |
| 3 | 791 | 118 | 29 | 11 | 2 | 2 | 1 | 0 | 0 |
| 2 | 1095 | 216 | 54 | 22 | 9 | 3 | 0 | 1 | 2 |
| 1 | 1786 | 510 | 176 | 77 | 28 | 20 | 8 | 8 | 16 |
| 0 | 3635 | 1379 | 635 | 302 | 164 | 96 | 57 | 37 | 173 |
|  | 1 | 2 | 3 | 4 | 5 | 6 | 7 | 8 | ≥9 B |

FIG. 1

| Nr. | B | L | code word | | length |
|---|---|---|---|---|---|
| 1 | – | – | 11 | (end of block) | 2 |
| 2 | 1 | 0 | 010s | | 4 |
| 3 | 1 | 1 | 1000s | | 5 |
| 4 | 1 | 2 | 1001s | | 5 |
| 5 | 2 | 0 | 1010s | | 5 |
| 6 | 0 | 15 | 10110 | | 5 |
| 7 | 1 | 3 | 10111s | | 6 |
| 8 | 1 | 4 | 01100s | | 6 |
| 9 | 1 | 5 | 01101s | | 6 |
| 10 | 2 | 1 | 01110s | | 6 |
| 11 | 3 | 0 | 01111s | | 6 |
| 12 | 1 | 6 | 001000s | | 7 |
| 13 | 1 | 7 | 001001s | | 7 |
| 14 | 1 | 8 | 001010s | | 7 |
| 15 | 1 | 9 | 001011s | | 7 |
| 16 | 2 | 2 | 001100s | | 7 |
| 17 | 3 | 1 | 001101s | | 7 |
| 18 | 4 | 0 | 001110s | | 7 |
| 19 | 5 | 0 | 001111s | | 7 |
| 20 | 1 | 10 | 0001000s | | 8 |
| 21 | 1 | 11 | 0001001s | | 8 |
| 22 | 1 | 12 | 0001010s | | 8 |
| 23 | 1 | 13 | 0001011s | | 8 |
| 24 | 1 | 14 | 0001100s | | 8 |
| 25 | 2 | 3 | 0001101s | | 8 |
| 26 | 2 | 4 | 0001110s | | 8 |
| 27 | 6 | 0 | 0001111s | | 8 |
| 28 | 1 | 15 | 00001000s | | 9 |
| 29 | 2 | 5 | 00001001s | | 9 |
| 30 | 3 | 2 | 00001010s | | 9 |
| 31 | 4 | 1 | 00001011s | | 9 |
| 32 | 7 | 0 | 00001100s | | 9 |
| 33 | 8 | 0 | 00001101s | | 9 |

FIG. 3

| Nr. | B | L | code word | length |
|---|---|---|---|---|
| 34 | 2 | 6 | 00001110s | 9 |
| 35 | 2 | 7 | 000001000s | 10 |
| 36 | 2 | 8 | 000001001s | 10 |
| 37 | 2 | 9 | 000001010s | 10 |
| 38 | 3 | 3 | 000001011s | 10 |
| 39 | 4 | 2 | 000001100s | 10 |
| 40 | 5 | 1 | 000001101s | 10 |
| 41 | 6 | 1 | 000001110s | 10 |
| 42 | 0 | 0 | 0000011111 | 10 |
| 43 | 2 | 10 | 0000011110s | 11 |
| 44 | 3 | 4 | 0000001000s | 11 |
| 45 | 3 | 5 | 0000001001s | 11 |
| 46 | 4 | 3 | 0000001010s | 11 |
| 47 | 5 | 2 | 0000001011s | 11 |
| 48 | 7 | 1 | 0000001100s | 11 |
| 49 | 2 | 11 | 0000001101s | 11 |
| 50 | 2 | 12 | 0000001110s | 11 |
| 51 | 2 | 13 | 0000001111s | 11 |
| 52 | 3 | 6 | 00000001000s | 12 |
| 53 | 3 | 7 | 00000001001s | 12 |
| 54 | 3 | 8 | 00000001010s | 12 |
| 55 | 4 | 4 | 00000001011s | 12 |
| 56 | 4 | 5 | 00000001100s | 12 |
| 57 | 5 | 3 | 00000001101s | 12 |
| 58 | 6 | 2 | 00000001110s | 12 |
| 59 | 8 | 1 | 00000001111s | 12 |
| 60 | 9 | 0 | 00001111s+++++++ | 16 |
| 61 | 0 | 1 | 00000000100000-- | 16 |
| 62 | 0 | 2 | 00000000100001-- | 16 |
| 63 | 0 | 3 | 00000000100010-- | 16 |
| 64 | 0 | 4 | 00000000100011-- | 16 |
| 65 | 0 | 5 | 00000000100100-- | 16 |

FIG. 4

| Nr. | B | L | code word | length |
|---|---|---|---|---|
| 66 | 0 | 6 | 00000000100101-- | 16 |
| 67 | 0 | 7 | 00000000100110-- | 16 |
| 68 | 0 | 8 | 00000000100111-- | 16 |
| 69 | 0 | 9 | 00000000101000-- | 16 |
| 70 | 0 | 10 | 00000000101001-- | 16 |
| 71 | 0 | 11 | 00000000101010-- | 16 |
| 72 | 0 | 12 | 00000000101011-- | 16 |
| 73 | 0 | 13 | 00000000101100-- | 16 |
| 74 | 0 | 14 | 00000000101101-- | 16 |
| 75 | 2 | 14 | 00000000101110s- | 16 |
| 76 | 2 | 15 | 00000000101111s- | 16 |
| 77 | 3 | 9 | 00000000110000s- | 16 |
| 78 | 3 | 10 | 00000000110001s- | 16 |
| 79 | 4 | 6 | 00000000110010s- | 16 |
| 80 | 4 | 7 | 00000000110011s- | 16 |
| 81 | 4 | 8 | 00000000110100s- | 16 |
| 82 | 4 | 9 | 00000000110101s- | 16 |
| 83 | 5 | 4 | 00000000110110s- | 16 |
| 84 | 5 | 5 | 00000000110111s- | 16 |
| 85 | 6 | 3 | 00000000111000s- | 16 |
| 86 | 7 | 2 | 00000000111001s- | 16 |
| 87 | 8 | 2 | 00000000111010s- | 16 |

METHOD AND APPARATUS FOR BIT RATE REDUCTION

BACKGROUND OF THE INVENTION

The invention relates to a method of and a circuit arrangement for bit rate reduction. Bit rate reduction is carried out when coding a signal, which comprises a series of digital signal values and has a signal value A, occurring most frequently in runs.

An Article by Wen-Hsiung Chen and William K. Pratt (Chen, When-Hsiung and Pratt, William K.; Scene Adaptive Coder IEEE Transactions on Communications, vol. Com-32, No. 3, March 1984, pages 225-232) describes a coding process of video signals for the purpose of transmitting video pictures of satisfactory quality at a minimum possible bit rate. Coding is effected in several steps. First, equally large video picture sections which are represented by blocks of pixels are subjected to a Discrete Cosine Transform. In this transform process, a special two-dimensional Fourier transform is used. By the transform, a new block of values (coefficients) is obtained from the original block. This coefficient block has the property that a large number of its elements—thus a large number of the coefficients—are approximately 0 or exactly 0. A subsequent quantization of the coefficients always renders the greater part of the elements 0 so that a subsequent Huffman coding would therefore already involve a considerable bit rate reduction. The authors of the above-mentioned Article achieve a further bit rate reduction in that the frequent occurrence of zero runs in the intermediate signal in which the coefficients are serially arranged is utilized by means of a Huffman coding.

It is known that in a Huffman coding in which the codewords have different lengths, statistic properties of the signal to be coded are utilized. In the present case this particularly implies that the frequency with which zero runs having lengths 1, 2, 3, etc. occur in the above-mentioned intermediate signal is investigated. The shortest Huffman codeword is then assigned to the run that occurs most frequently. The next larger codeword is assigned to the run that occurs less frequently, and so forth.

For coding the intermediate signal two Huffman code tables are required according to the above-mentioned Article. A first table shows how the (quantized) coefficients different from 0 are to be coded. Only the coefficient values are coded because equally large coefficients also occur at the same frequency. The signs are transmitted in a separate bit. A second table shows how the run length is to be coded. In order that the codewords of one table can be distinguished from those of the other table during decoding, a separate codeword, the so-called run length prefix, is used for the identification of the coded run length.

SUMMARY OF THE INVENTION

It is an object of the invention to provide a coding method for a signal of the kind mentioned in the opening paragraph and comprising in a special case, an intermediate signal resulting from a picture coding operation, leading to a bit rate reduction which is larger than that hitherto known.

This object is achieved by assigning a Huffman codeword to each run of signals having the value A, where A having length 0, 1, 2 etc., together with the signal value subsequent to the run or together with the signal value preceding the run.

Advantageous embodiments of the invention, particularly for exeptional cases of the signal characterized in the opening paragraph as well as a circuit arrangement for carrying out the method according to the invention, can be derived from the sub-claims.

BRIEF DESCRIPTION OF THE DRAWING

The invention will now be described in greater detail by way of examples with reference to the accompanying drawings in which FIG. 1 is a table stating the occurrence of events, FIG. 3 to FIG. 5 show a coding table, and FIG. 6 shows the circuit diagram of arrangements for coding video signals according to the invention.

DETAILED DESCRIPTION OF THE INVENTION

Figure 2:
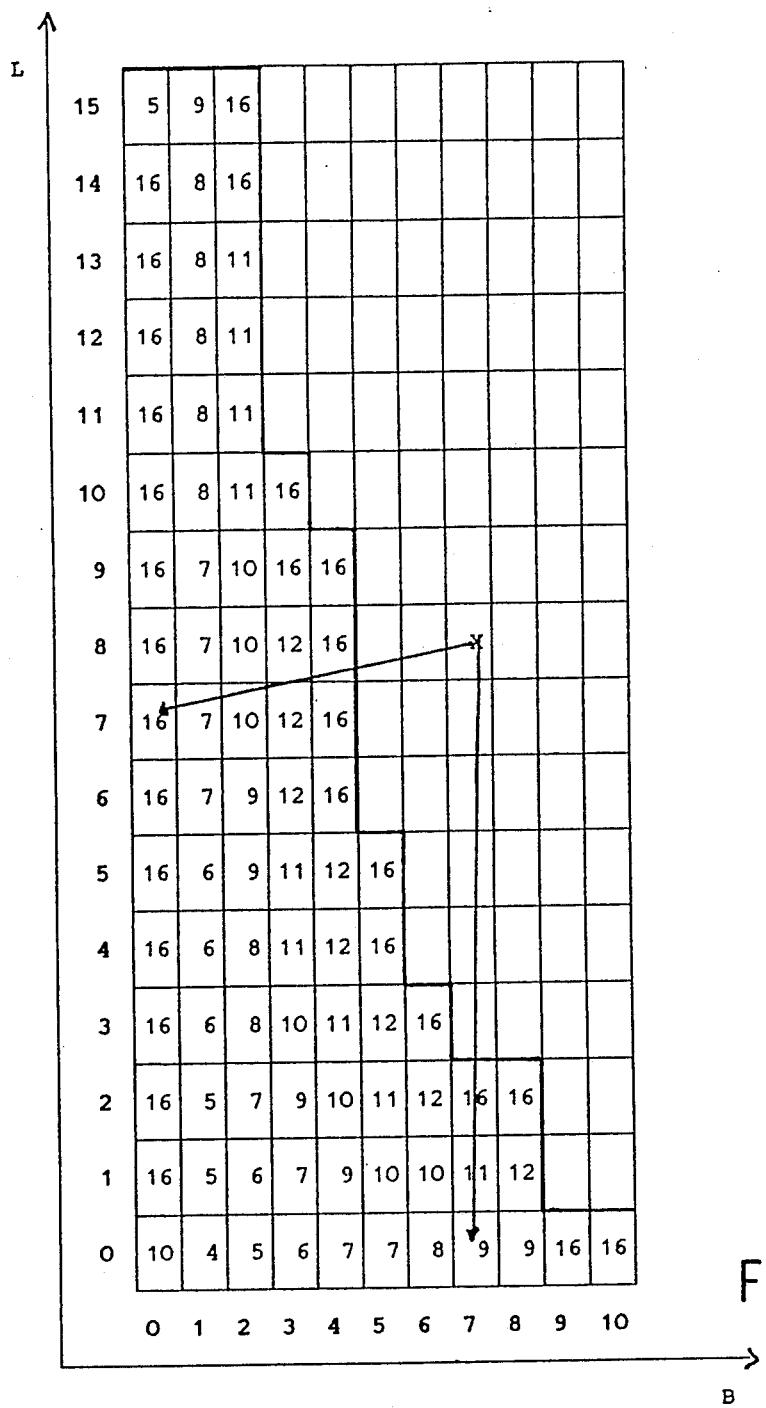
FIG. 2 is a further table elucidating the split-up of the events.

In the following embodiments, the intermediate signal referred to results from the transform coding of blocks of picture elements (pixels). The signal values of the intermediate signal thus represent the transform coefficients. As stated above, the coefficient which occurs most frequently in runs within the intermediate signal is represented herein as having the signal value A. In the following embodiments, signal value A equals zero or approximately zero zero (referred to hereinafter as the "zero-coefficient") because it appears most frequently in runs after transform coding. All coefficients not having a value of zero will be referred to hereinafter as "non-zero coefficients".

As used in the following description, a run of zero coefficients and the non-zero coefficient which immediately precedes or follows this run, is referred to as an event. Each non-zero coefficient which is not preceded or followed by one or more zero coefficients is also referred to as an event. According to the invention these events are to be coded.

It is to be noted that some events are more likely to occur than others. For example coefficients having small values will occur more frequently than coefficients having large values, and it is more likely that a coefficient having a small value will be preceded by a run of zero coefficients.

FIG. 1 shows the frequency distribution of the above-mentioned events in the case of a cosine-transformed and subsequently quantized video signal. Each field of the table represents an event characterized by the zero run length L and by the value B of the subsequent (quantized) coefficient. The values B proceed through the natural numbers without the zero and the length L proceeds through the natural numbers with the zero. In order that the table does not become arbitrarily large, all events with B larger than or equal to 9 are combined to an overall event. The same applies to L when larger than or equal to 9.

The numbers in the different fields indicate how often the associated event occurs in a quantized video signal with approximately 15000 signal values. The assignment of Huffman codewords is shown in the table: the series L=0, B=1 acquires the shortest codeword; this is followed by the series L=1, B=1 with the next longer codeword, and so forth.

If the assigned codewords instead of the frequencies are introduced in the event fields of the table, a two-dimensional coding table is obtained. It is not shown for the events according to FIG. 1 because such coding tables can generally be set up by those skilled in the art. For the sake of completeness it is to be noted that a maximum number of 11 bits follows for the events in which L is larger than or equal to 9 or in which B is larger than or equal to 9 after the assigned Huffman codeword, which bits give the receiver accurate information about the value of L and the value of B, respectively.

An additional bit rate reduction of 12% is obtained when coding video signals in accordance with the above-mentioned two dimensional coding table as compared with the coding method described in the opening paragraph.

This additional bit rate reduction is possible because, for example if the probability of a coefficient having the value 2 occurring equals P1, and the probability of run of three zero-coefficients occurring equals P2, and the probability of the run of three zero-coefficients occurring followed by a coefficient having the value 2, equals P3; probability P3 will not be equal to the product of probabilities P1 and P2.

The limitation of FIG. 1 will now be considered in greater detail. As is evident from the above-mentioned embodiments the number of the events to be coded in accordance with FIG. 1 is kept within efficient limits because all zero runs with an equally large subsequent value of a coefficient are considered as an event if the run length L is larger than eight.

Similarly, all zero runs of equal length are considered as an event if the subsequent value B of a coefficient is larger than eight.

As is shown in FIG. 1, relatively rarely occurring events are concerned, and therefore they are coded with relatively long Huffman codewords. Since the receiver for decoding should know the exact zero run length or the exact value of a coefficient without any loss of information, an additional codeword is added to the Huffman codeword—as already indicated above—from which the exact length or the exact value or both can be derived.

A clearly defined state is encoded by the Huffman codeword and the additional information. Since the number of bits of such combinations is also dependent on the statistic properties of the signal, such combinations should also be present at the receiver and the decoder in order that the state which is based on these combinations can unambiguously be recognized at the receiver end.

The Huffman codewords defined in this sense may be up to 30 bits long. Since the processing of codewords which are at most 16 bits long does not require any special arrangements, but is possible, for example with a 16-bit microprocessor, given events are split into sub-events—to improve the method described so far—such that codewords whose length is at most 16 bits are sufficient for coding all events and sub-events. This split-up will now be described in greater detail.

Firstly, an event to be coded consisting of an L=Lm zero run with subsequent coefficient of the value B=Bm is designated by (Lm, Bm). In contrast to the foregoing, Bm=0 is now also explicitly admitted. It is true that the two-dimensional diversity of events (Lm, Bm) occurring in practice is finite, because arbitrarily large values of coefficients do not occur, but it is very large. Consequently, the Huffman codewords to be used are correspondingly large as regards number and length. To reduce the overall number of the events to be coded the starting point is that, for example a run of 19 zeros with subsequent coefficient of the value 7 can be split up into sections, the first of which represents a run of 16 zeros, the second of which represents a run of 3 zeros and the third of which is a run without a zero and subsequent coefficient of the value 7. Each of these sections is now considered as a sub-event which is coded by a Huffman codeword. The length of each section is below a given value which can be predetermined and which will be further dealt with below.

This split-up is illustrated in FIG. 2. In the horizontal direction all occurring values B—including the value 0—of the coefficients are shown. In the vertical direction the length—also starting at 0—of coefficient runs of the value 0 is shown. The "events Fields" shown symbolize the event (Lm, Bm) i.e. Lm zeros followed by a coefficient of the value Bm. The event (0, 3) for example, means that a coefficient of the value 3 is preceded by a run length 0 which means that there is no coefficient of the value 0 preceding. Isolated zeros in the signal are symbolized by the event (0, 0). The reference (3, Bm) refers inter alia to the event in which a coefficient of the value Bm is succeeded by three successive zeros. Since the value of zero is also admitted for Bm, the event (3, 0) means that there are four successive zeros.

FIG. 2 shows a polygonal curve in a solid line dividing the series fields into two ranges. The left-hand range comprises the events which are referred to as being codable and the right-hand range shows the events which are referred to as non-codable. The maximum length for a section of signal values—corresponding to a codable event—is 16; the events (0, 15), (1, 15) and (2, 15) are involved. All other codable events correspond to signal sections which are shorter. The division into codable and non-codable events is not completely arbitrary; the most frequently occurring event should be associated with the codable ones. The crossed non-codable event (8, 7) is split, for example, into the events (0, 7) and (7, 0). There are various possibilities for the split-up; the simplest is the indicated "projection on the event axes".

The numbers in the event fields which are associated with the codable events signify the length—hence the number of bits—of the Huffman codewords with which the events are coded. The codewords also comprise the signs of the coefficients and possibly data about the magnitude of the value B; none of them is longer than 16 bits. In setting up the Huffman codewords it was assumed that coefficients having values of more than 136 do not occur.

Figures 5, 6:
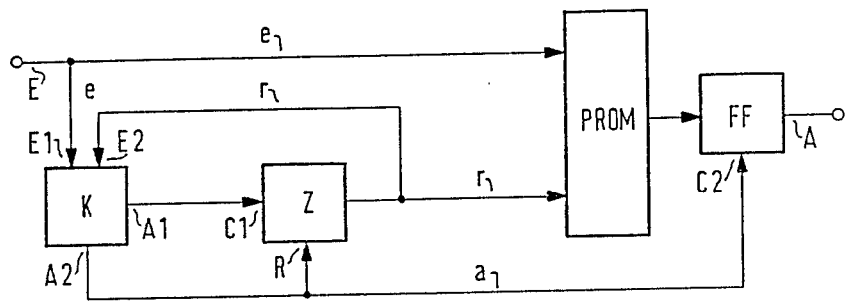

FIGS. 3 to 5 show the exact structure of the Huffman codewords used. The first codeword 11 represents the coded signal value for characterizing a block end; at the transmission it succeeds the last codeword which is associated with a coefficient block. The first column of these figures states consecutive numbers, the second column states the values B of the coefficients and the third states the lengths L of the zero runs. The two latter data combined result in the "coordinates" of a codable event according to FIG. 2. In the fourth column of FIGS. 3–5 the code words are shown bitwise. The bit s denotes the sign bit, the positions indicated by "—" are meaningless, and the positions indicated by "+" comprise the coded values of the coefficients in so far as they are larger than eight. The last column once more states the length of the Huffman codewords.

A possibility of further reducing the bit rate results from the fact that—as in the present embodiment—the signal to be coded is structured in accordance with blocks. As already indicated, the coefficients of a coefficient block are separated from those of the next block by an "end-of-block" signal. Also this "end-of-block" signal is converted into a codeword (compare FIG. 3) while the sequence of m (codable) events of the type $$\begin{aligned}&(L1, B1)\\&(L2, B2)\\&\ldots\\&(Lm, Bm)\end{aligned} \quad (1)$$

and into a sequence of assigned codewords. The number m of the events is dependent on the special values of the coefficients. If the overall coefficient block comprises, for example 63 zeros with subsequent coefficients of the value 1, it is split up into only one event, namely (63, 1) or into several codable events according to FIG. 2. As it is not known in advance into how many codable events a coefficient block is split, the separate blocks must for this reason already be separated from one another by means of an "end-of-block" signal. At the receiver end the transmitted Huffman codewords are retransformed into events and these events are again converted into a sequence of coefficients. The receiver knows that, for example, 64 coefficients are associated with a coefficient block.

For further explanation and for the sake of simplicity, it is assumed that $4 \times 4$ blocks are concerned, so that one block comprises a total of 16 coefficients. All data associated with a block are separated from the data of the subsequent block by an "end of block" sign. This sign and the corresponding codeword is excepted from the split-up of the signal to be coded in accordance with the events. If, for example the sequence of coefficients of a block in a decimal representation has the form of $$XX\ 4005000050000001\ XX, \quad (2)$$

The block is split up according to scheme (1) into the following events.

$$\begin{aligned}&(0, 4)\\&(2, 5)(4, 5)\\&(6, 1)\end{aligned} \quad (3)$$

In order that the coefficient sequence of a block can at any rate be split into events in accordance with scheme (1) or (3) above, the coefficients are temporarily stored before they are further processed. The temporal sequence of the coefficients in scheme (2) and that of the events in schemes (1) and (3) corresponds to the sequence of their written registration (European writing direction assumed). The symbols XX in the embodiment according to scheme (2) symbolize the "end-of-block" signs of the previous block and the represented block.

The coefficients in scheme (2) which are different from 0 are all positive and are represented as integral multiples of the smallest unit, namely 1. As can be seen from scheme (3), the last event is the event (6, 1). The Huffman codewords assigned to the events are not indicated.

Firstly, the weight of reception of the last event, namely (6, 1) of the block according to (2) is checked for the receiver. In the coding of pictures general experience has proved that the transmission of events with a run of more than five zeros become less worthwhile as the value of the subsequent coefficient is smaller. If in accordance with the rule based on experience, checked events for which $L=5$ and $B=1$ are not transmitted, the transmission of the last event does not take place. In that case the preceding series (4, 5) is checked in accordance with the same criterion. In the example according to (2) the check for this block is ended because the event (4, 5) and the assigned Huffman codeword must be transmitted.

After decoding the Huffman codewords at the receiver end all coefficients of the block according to scheme (2) can be recovered, but for those which are associated with non-transmitted events. However, since these are associated with the last coefficients of the block, the decoded coefficients at the receiver end are augmented with coefficients of the value 0 until the overall number of coefficients is 16.

FIG. 6 shows a circuit arrangement realising a simple split-up of the sequence of coefficients in accordance with codable events. The supply of clock pulses and details of the logic operation of binary values are not shown because they are known to those skilled in the art. In the circuit arrangement according to FIG. 6 events are coded which consist of a run of coefficients of the value zero and a subsequent coefficient. If the run length L in the signal to be coded exceeds a predetermined length Lmax, the associated event cannot be encoded and is split into codable events. Due to the predetermined maximum length Lmax which is independent of the subsequent coefficient, no delays or intermediate storages of the coefficients are required.

The coefficients are serially applied from an input E via a multiple lead e to the address inputs of an addressable memory PROM and to a first input E1 of a comparator circuit K. The multiple lead e comprises as many wires as bits are required for the binary representation of a coefficient. A coding table is filed in the memory PROM.

The position of a counter Z is applied to a second input E2 of the comparator K—via a multiple lead f. The multiple lead f is simultaneously connected to further address inputs of the memory PROM.

It is assumed that a coefficient which is different from zero is present at the input E1. In this case the comparator circuit K supplies a pulse from an output A2, which pulse is applied via a lead a to the reset input R of the counter Z and to the clock input C2 of a flipflop circuit FF. The counter is reset to the zero position with this pulse and the codeword which is present at the output of the memory PROM is bit-parallel taken over in the flipflop circuit FF. The codeword can be derived from the output A of the circuit arrangement according to FIG. 6. The codewords present at output A are not the ultimate Huffman codewords because all of them have the same length. To convert codewords of the same length into codewords of unequal length, and conversely—the latter conversion is required at the receiver end—reference is made to patent applications DE 35 10 902, DE 35 10 901 and DE 36 32 682.

If a zero is present at the input E1, the comparator circuit K supplies a counting pulse from a further output A1 and applies it to the clock input C1 of the counter Z which increases it count by one unit. The comparator circuit K continuously compares the actual counting with the value Lmax which is stored in one of its memories not shown. If the count reaches the value Lmax, the supply of a further counting pulse does not take place. Instead, the reset or transfer pulse is supplied from the output A2.

The complete coefficients—thus also their signs—are processed in the circuit arrangement according to FIG. 6. In a modification the signs of the coefficients are applied via a separate wire to the output A of the circuit arrangement and to accept them from a comparison by the comparator circuit K and from determining the codewords by the programmable memory PROM.

What is claimed is:

1. A circuit arrangement for coding a signal comprising a run of zero coefficients and a subsequent coefficient, wherein said coefficients are applied with predetermined delays to the address inputs of a memory (PROM) and to a first input (E1) of a comparator circuit (K), in that a counter (Z) is provided whose count is applied to further address inputs of the memory (PROM) and to a second input (E2) of the comparator circuit (K), in that the comparator circuit (K) supplies a counting pulse to the counter (Z) from a first output (A1) if a zero coefficient is present at the first input (E1) and if the count has not exceeded a value stored in a memory of the comparator circuit (K) supplies a pulse from a second output (A2) if the conditions for the supply of a counting pulse are not fulfilled, and in that the counter (Z) is reset by means of the pulse at the second output (A2) of the comparator circuit (K), and in that the codeword present at the outputs of the memory (PROM) is transferred to an intermediate memory (FF).

2. A circuit arrangement as claimed in claim 1, characterized in that only the values of the coefficients are applied to the address inputs of the memory (PROM) and the comparator circuit (K) and in that the sign bits of the coefficients are supplied through a separate wire to the output (A) of the circuit arrangement.

3. In a method of coding a signal comprising a sequence of coefficients which results after a blockwise transform of pixels of a video signal with subsequent quantization, for transmission at a reduced bit rate, said signal comprising a plurality of zero coefficients, and a plurality of non-zero coefficients said method comprising the steps of:
   (a) deriving from said signal, a plurality of events each comprising a run of said zero-coefficients having a respective run length and preceded or followed by at least one non-zero coefficient, and
   (b) for each of said events, determining said respective run length and assigning a code word to represent said non-zero coefficient and said run length.

4. The method of claim 3, wherein said code words are Huffman code words.

5. A method as claimed in claim 4, characterized in that a Huffman codeword is not transmitted if the length of the associated run of zero-coefficients exceeds a barrier which is dependent on the magnitude of the subsequent non-zero-coefficients.

6. A method as claimed in claim 4, characterized in that the signal comprises a sequence of coefficients which results after a blockwise transform of pixels of a video signal with subsequent quantisation and in that a checked Huffman codeword is not transmitted if the length of the associated zero run is larger than five and if the magnitude of the subsequent non-zero-coefficient has the smallest possible value different from zero.

7. A method as claimed in claim 4, characterized in that the Huffman codeword is independent of the sign of that non-zero coefficient which succeeds or precedes the run of zero-coefficients and in that the sign is coded by a separate bit.

8. A method for coding a signal for transmission at a reduced bandwidth, comprising the steps of:
   (a) transforming said signal into a sequence comprising zero coefficients occurring in runs and non-zero coefficients;
   (b) deriving from said sequence, a plurality of events each comprised of a run of zero coefficients having a respective run length, which is preceded or followed by at least one non-zero coefficient, and
   (c) for each of said events, determining the run length and assigning a code word to represent said run length and said non-zero coefficient.

9. The method of claim 8, comprising the additional steps of:
   determining for each event, whether the run length of said run of zero coefficients exceeds a predetermined length and if so assigning the same code word to represent each said run length and respective non-zero coefficient.

10. The method of claim 8, comprising the additional steps of:
    determining for each event, whether the non-zero coefficient exceeds a predetermined value and if so assigning the same code to represent said run length and said non-zero coefficient.

11. The method of claim 8, comprising the additional steps of:
    determining whether the run length of each event exceeds a predetermined run length and if so, splitting said respective event into a plurality of sections so that each of said sections has a run length below said predetermined run length, and assigning a code word to each section.

12. An apparatus for coding a signal comprising a run of zero coefficients and a subsequent coefficient, said apparatus comprising:
    (a) means for determining if the length of said run exceeds a predetermined length;
    (b) splitting means coupled to said length determining means, for splitting a run which exceeds said predetermined length into a plurality of codable events; and
    (c) coding means coupled to said splitting means for assigning a code word to represent each said codable event.

13. In a method of coding a signal comprising a sequence of coefficients which results after a blockwise transform of pixels of a video signal with subsequent quantization, for transmission at a reduced bit rate, said signal comprising a plurality of first coefficients having a signal value A and occurring in runs most frequently in said signal, and a plurality of second coefficients having values not equal to A, said method comprising the steps of:
    (a) deriving from said signal, a plurality of events each comprising a run of said first coefficients having a respective run length, which is preceded or followed by at least one second coefficient, and
    (b) for each of said events, determining said respective run lengths and assigning a code word to represent said second coefficient and said run length.

* * * * *

(12) EX PARTE REEXAMINATION CERTIFICATE (7179th)
United States Patent
Vogel

(10) Number: US 4,901,075 C1
(45) Certificate Issued: Nov. 24, 2009

(54) METHOD AND APPARATUS FOR BIT RATE REDUCTION

(75) Inventor: Peter Vogel, Diepersdorf (DE)

(73) Assignee: U.S. Philips Corporation, New York, NY (US)

Reexamination Request:
No. 90/010,104, Feb. 7, 2008

Reexamination Certificate for:
Patent No.: 4,901,075
Issued: Feb. 13, 1990
Appl. No.: 07/096,177
Filed: Sep. 11, 1987

(30) Foreign Application Priority Data

| | | | |
|---|---|---|---|
| Sep. 13, 1986 | (DE) | ............................................. | 3631252 |
| Nov. 8, 1986 | (DE) | ............................................. | 3638127 |
| May 3, 1987 | (DE) | ............................................. | 3717399 |

(51) Int. Cl.
*H03M 7/42* (2006.01)
*G06T 9/00* (2006.01)
*H04N 7/30* (2006.01)

(52) U.S. Cl. .............................. 341/63; 341/59; 358/1.9; 375/E7.226

(58) Field of Classification Search ........................ None
See application file for complete search history.

(56) References Cited

U.S. PATENT DOCUMENTS

| | | | |
|---|---|---|---|
| 3,925,780 A | 12/1975 | Van Voorhis | |
| 3,984,833 A | 10/1976 | Van Voorhis | |
| 4,092,676 A | 5/1978 | Saran | |
| 4,136,363 A | 1/1979 | Saran | |
| 4,316,222 A | 2/1982 | Subramaniam | |
| 4,363,036 A | 12/1982 | Subramaniam | |
| 4,420,771 A | 12/1983 | Pirsch | |
| 4,472,803 A | 9/1984 | Iijima | |
| 4,494,151 A | 1/1985 | Liao | |
| 4,535,320 A | 8/1985 | Weaver | |
| 4,698,672 A | 10/1987 | Chen et al. | |
| 4,901,075 A | 2/1990 | Vogel | |

FOREIGN PATENT DOCUMENTS

| | | |
|---|---|---|
| JP | 56073934 | 6/1981 |
| JP | 58151751 | 9/1983 |

OTHER PUBLICATIONS

Stevan D. Bradley, "Optimizing a Scheme for Run Length Coding," Proceedings of the IEEE, Jan. 1969, pp. 108–109.
E. Dubois and J.L. Moncet, "Encoding and Progressive Transmission of Still Pictures in NTSC Composite Format Using Transform Domain Methods," IEEE Transactions on Communications, Mar. 1986, pp. 310–319, vol. Com.–34, No. 3.
Roy D. Hunter and A. Harry Robinson, "International Digital Facsimile Coding Standards," Proceedings of the IEEE, Jul. 1980, pp. 854–867, vol. 68, No. 7.
P. Pirsch, "Adaptive Intra–Interframe DPCM Coder," The Bell System Technical Journal, May–Jun. 1982, pp. 747–764, vol. 61, No. 5.
James J. Pearson, "A CAQ Bandwidth Reduction System for RPV Video Transmission," SPIE, 1975, pp. 101–107, vol. 66 Efficient Transmission of Pictorial Information.
David A. Huffman, "A Method for the Construction of Minimum–Redundancy Codes," Proceedings of the I.R.E., Sep. 1952, pp. 1098–1101.
Norman Abramson, *Information Theory and Coding*, 1963, pp. 77–93, McGraw–Hill Book Company.
Robert G. Gallager, *Information Theory and Reliable Communication*, 1968 pp. 514–517, John Wiley and Sons.

(Continued)

*Primary Examiner*—Matthew Heneghan

(57) ABSTRACT

A method and apparatus for coding a signal for transmission in order to achieve improved reduction in the bit rate. A signal is a transform coded in order to form a sequence of zero coefficients and non-zero coefficients, and run lengths of zero coefficients together with preceding or subsequent non-zero coefficients are grouped as events and coded.

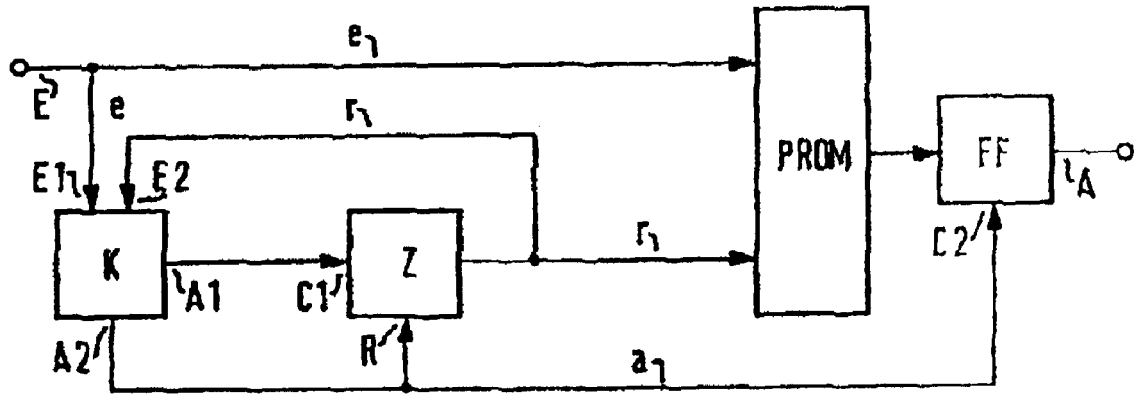

OTHER PUBLICATIONS

Ronald B. Arps, "Binary Image Compression," Image Transmission Techniques (Advances in Electronics and Electron Physics Supplement 12), 1979, pp. 219–276, Academic Press.

T.S. Huang, "Coding of Two–Tone Images," IEEE Transactions on Communications, Nov. 1977, pp. 1405–1424, vol. Com 25, No. 11.

Wen–Hsiung Chen, Member, IEEE, and William K. Pratt, Senior Member, IEEE, "Scene Adaptive Code," IEEE Transactions for Communications, vol. COM–32, No. 3, Mar. 1984 (p. 225–232).

Block coding using a two–dimensional run–length table, Sep. 9, 1986 (7 pgs).

"Upper Bound, Lower Bound and Run–Length Substitution Coding", Henry H.J. Liao, Xerox Corporation, El Segundo, Calif. 90245, NTC'77 Conference Record vol. 3, IEEE Publication No. 77CH1202–2 CSCB, Library of Congress Card No. 57–20724 (7 pgs).

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 3, 4, 7, 8 and 11 is confirmed.

Claims 1, 2, 5, 6, 9, 10, 12 and 13 were not reexamined.

\* \* \* \* \*